United States Patent [19]

Soule et al.

[11] Patent Number: 5,384,940
[45] Date of Patent: Jan. 31, 1995

[54] SELF-LOCKING HEAT SINKS FOR SURFACE MOUNT DEVICES

[75] Inventors: Christopher A. Soule, Concord; Gary F. Kuzmin, Gilford, both of N.H.

[73] Assignee: Aavid Engineering, Inc., Laconia, N.H.

[21] Appl. No.: 281,257

[22] Filed: Jul. 27, 1994

Related U.S. Application Data

[63] Continuation of Ser. No. 131,025, Oct. 1, 1993, abandoned, which is a continuation of Ser. No. 4,196, Jan. 13, 1993, abandoned, which is a continuation of Ser. No. 843,462, Feb. 28, 1992, abandoned.

[51] Int. Cl.$^6$ .................. H05K 7/20; B60N 3/02
[52] U.S. Cl. ................... 24/453; 24/628; 257/719; 361/719; 361/809; 411/508
[58] Field of Search ............. 174/138 G; 24/297, 453, 24/607, 625, 628, 458; 257/706, 707, 718, 719; 411/337, 347, 508, 913; 248/27.1; 361/689, 690, 704, 709, 784, 807, 809, 717–719

[56] References Cited

U.S. PATENT DOCUMENTS

| | | | |
|---|---|---|---|
| 2,567,508 | 9/1951 | Carson | 24/458 |
| 3,154,281 | 10/1964 | Frank | 248/201 |
| 3,688,635 | 9/1972 | Fegen | 361/412 |
| 4,224,663 | 9/1980 | Maiese | 363/144 |
| 4,586,843 | 5/1986 | Heng | 403/252 |
| 4,709,302 | 11/1987 | Jordan | 361/388 |
| 4,760,495 | 7/1988 | Till | 361/412 |
| 4,934,885 | 6/1990 | Woods | 411/44 |
| 4,981,322 | 1/1991 | Dowd | 24/453 |
| 5,010,949 | 4/1991 | Dehaine | 165/76 |
| 5,124,883 | 6/1992 | Bakker | 361/386 |

FOREIGN PATENT DOCUMENTS

1146796  3/1969  United Kingdom ................ 411/913

OTHER PUBLICATIONS

Eaton Engineered Fasteners Catalog, Self–Sufficient, One–Piece, Tinnerman® Dart Type Fasteners, pp. 2–15, No. 18, p. 3.
ITW Fastex, Panel Fasteners/Snap–In.

*Primary Examiner*—Gerald P. Tolin
*Attorney, Agent, or Firm*—Fish & Richardson

[57] ABSTRACT

A device for attaching a heat sink to an electronic package comprises a pin having a compressible point, the point being adapted to pass through aligned holes in a heat sink and a printed circuit board so that the point compresses as it passes into two holes and flexes back to an expanded position after it exits the printed circuit board hole opposite the heat sink thereby holding the heat sink to the board with the electronic package therebetween.

3 Claims, 1 Drawing Sheet

SELF-LOCKING HEAT SINKS FOR SURFACE MOUNT DEVICES

This is a continuation of application Ser. No. 08/131,025, filed Oct. 1, 1993, now abandoned, which is a continuation of application Ser. No. 08/004,196, filed Jan. 13, 1993, which is a abandoned, which is a continuation of application Ser. No. 07/843,462, filed Feb. 28, 1992, which is abandoned.

FIELD OF THE INVENTION

This invention relates to the field of heat sinks, and in particular, the means for attaching heat sinks to a circuit board or other similar device.

BACKGROUND OF THE INVENTION

There is a strong trend on the part of the electronics industry to increase the density of electronic packaging on printed circuit boards and in semiconductors in order to boost performance and reduce cost. For example, with the increased density of the circuity at the chip level, the number of input/output (I/O) address lines is increased, and this improves communication with other logic circuitry. One problem associated with increasing the number of pins on a semiconductor package is the need to maintain or reduce the assembly cost. As a result, surface mounts or small outline packages have been developed. Without a method to remove the heat from these electronic packages, however, their performance is restricted, as the packages themselves do not contain means by which heat can be conducted away. Moreover, these packages do not incorporate the means by which a heat sink may be attached, and the high density of electronic trace leads emanating from the surface mount package severely restricts the type of attachment method for any heat sink which could be used. This is particularly important as any attachment used to affix heat sinks to these surface mount packages requires that the leads of the package remain accessible after the surface mount package has been attached to the printed circuit board. Also, any proposed heat sink attachment must minimize the stress load on and not damage the delicate leads of the surface mount package. If the leads are damaged by external forces such as might occur in attaching or removing a heat sink, the electrical connections between the surface mount package and the circuit traces on the printed circuit board may be broken.

In the prior art, heat sinks have been attached to such packages by bonding the heat sink to the package with a thermally conductive epoxy that closely matches the coefficient of thermal expansion of the plastic package. There are several disadvantages to this method. First, the application of the epoxy adhesives are labor intensive operations requiring proper mixing and the use of special tooling to attach the heat sink to the package. Further, these adhesives are somewhat hazardous, creating a disposal problem. Once applied, the heat sink cannot be easily removed from the package in the event the package has to be replaced or repaired.

SUMMARY OF THE INVENTION

The present invention relates to an improved heat sink attachment for electronic packages known as surface mount devices or for those packages which employ surface mount attachment technology either through direct attachment of the surface mount device to the printed circuit board or through the use of an electronic package socket.

In the preferred embodiment, dissipating heat from these surface mount electronic devices is accomplished by a heat sink which contacts the top surface of the package by means of a spring-loaded pin with a self-locking, compressible point. The pin is generally cylindrical, having an expanded top at one end and a pair of flexible prongs forming the compressible point at the other. A spring surrounds the shaft. In operation, the pin is inserted through a hole in the heat sink, which hole is too small to pass the expanded top. The point passes through the heat sink hole, however. The heat sink is placed over the package mounted on a board, and the pins aligned with holes in the board. The points of pins are pressed through the holes in the board. This compresses the flexible prongs, and the point passes through the hole. When the point ultimately passes through the hole, the flexible prongs of the pin re-expands so that the point then grasps the underside of the board thereby holding the pin in place. The spring is disposed around the shaft between the top and the heat sink, and it provides a bias that forces the heat sink against the package for good thermal contact. More than one pin is usually used, and preferably, the application of force from the spring- loaded pins should be symmetrical with respect to the surface mount package. The pin or pins may be easily removed by compressing the prongs so that the point will again slip through the hole in the printed circuit board.

BRIEF DESCRIPTION OF THE DRAWINGS

We turn now to a description of the preferred embodiment, after first describing the drawings.

DESCRIPTION OF THE PREFERRED EMBODIMENTS

Figure 1:
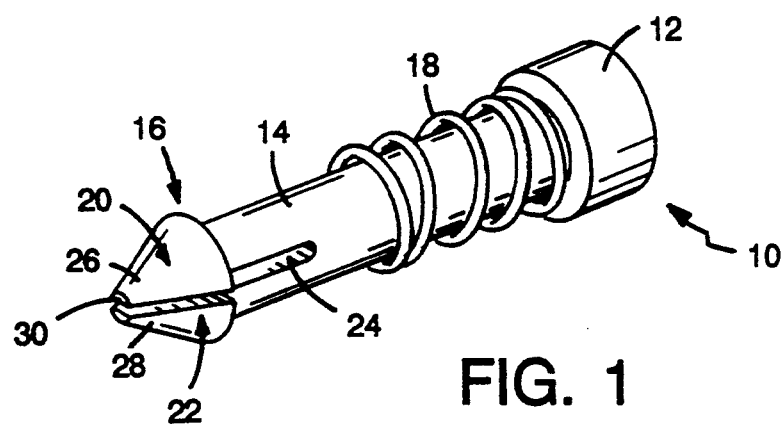
FIG. 1 is a perspective view of a self-locking pin of the present evention.

Referring now to FIG. 1, a pin according to the invention herein is shown at 10. The pin 10 is generally cylindrical, and it comprises an enlarged, cylindrical top 12, a shaft 14 and a point 16. A spring 18 is disposed around the shaft 14. The pin 10 is made of high strength nylon in the preferred embodiment, although other materials are possible. Preferably, the overall length of the pin 10 is 0.65 inches, with the shaft 14 being 0.46 inches in length, and 0.09 inches in diameter. Other dimensions are, of course, possible, and in fact necessary, depending upon the size of the package, the heat sink, and the thickness of the board and the size of its hold.

As shown in FIG. 1, the point 16 is comprised of a pair of prongs 20, 22 separated by a slot 24 which extends into the shaft 14. The slot 24 is about 0.2 inches long from the top of the point 16 in the preferred embodiment, and about 0.03 inches wide. Other dimensions are possible. Each prong 20, 22 includes a tapered surface 26, 28 which begins at an end 30 of the point 16 and expands back towards the shaft 14, together forming a cone shape bisected by the slot 24. As a result, the prongs 20, 22 can be compressed together slightly, but when the compressive forces are released, they will return to their original position, as shown in FIG. 1. The length of the surfaces 26, 28 is 0.10 inches in the preferred embodiment and the maximum diameter of the pair of prongs 20, 22 is about 0.140 inches. As with the other dimension of the preferred embodiment, different dimensions may be used.

Figure 2:
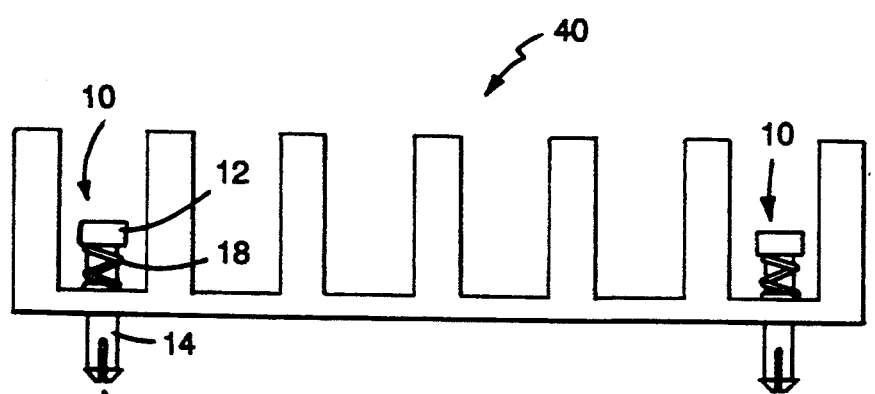
FIG. 2 is a side view of the pin of FIG. 1 attached to a heat sink.
Figure 3:
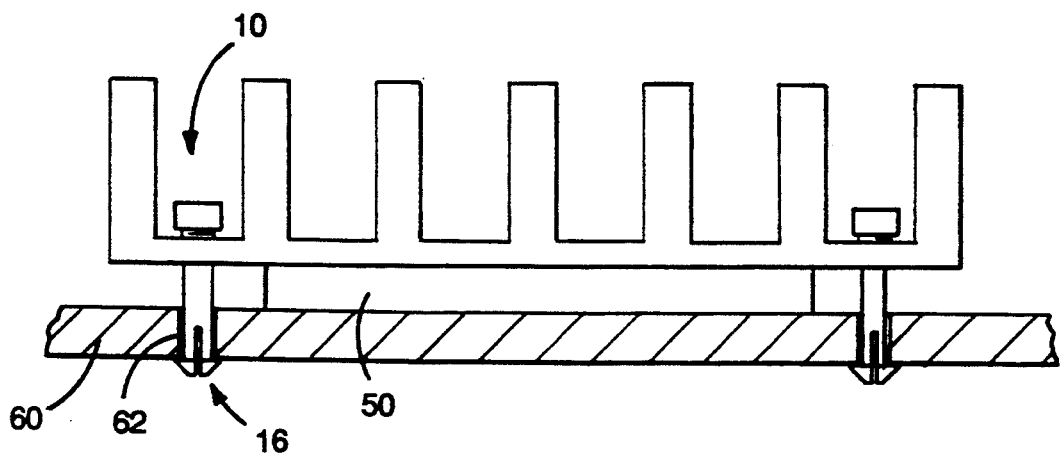
FIG. 3 is a side view of the pin of FIG. 1 showing the attachment of the pin to a heat sink, a package and a printed circuit board.

The operation of the pin 10 is shown in FIGS. 2 and 3. In FIG. 2, a pair of pins 10 is shown attached to a standard fin-type heat sink 40. Other types of heat sinks may be used with this invention, however. In each case, the point 16 of pin 10 is inserted through a hole (not shown) in the heat sink 40 so that the point 16 projects below the heat sink while the top 12 and spring 18 are disposed on the opposite side. The diameter of the hole (not shown) in the heat sink is larger than that of shaft 14 of the pin 10 so that the shaft 14 can move up and down in the hole. The top 12 of the pin 10 is too large to pass through the hole in the heat sink 40. In general, at least two pins 10 are used for a given heat sink, and usually four, positioned at the corners to distribute the force as evenly as possible when the heat sink is attached.

As shown in FIG. 3, the pins 10 are used to attach the heat sink 40 to a surface mount package 50 as follows. The surface mount package 50 is mounted on a printed circuit board 60. (Other electronic devices and other supports may, of course, be used.) The board 60 has holes 62 which are disposed adjacent to the package 50. After the pins 10 (usually four) are placed in the holes on the heat sink 40 as shown in FIG. 2, the heat sink 40 is then placed over the package 50, and the points 16 of the pins 10 are then lined up with the holes 62 in the board 60 on which the package 50 is mounted. Once aligned, the pins 10 are pushed down towards the holes 62. As a result of the tapered surfaces 26, 28, the point 16 slips into the holes 62. The sides of the holes 62 compress the prongs 20, 22 together, and as shown in FIG. 3, the points 16 fits through the holes 62. Once through the holes 62, however, the prongs 20, 22 flex back to their original, uncompressed position, and in so doing, grasp the underside of the board 60, thereby holding the pin 10 in place without damaging the surface mount package 50 or its electronic leads (not shown). As shown in FIG. 3, the heat sink 40 is then held in place against the surface mount package 50. The springs 18 associated with the pins 10 serve to springbias the heat sink 10 against the package to assure a good, thermally-conductive contact between the two. The pins 10 can easily be removed without damage to the surface mount package 50 or its leads (not shown) by compressing the prongs 20, 22 so that the pins 10 will slip through the holes 62. The spring 18 will assist with this action.

It will be appreciated that one feature of the invention is the variable pressure provided by the spring loaded pins 10. This allows effective attachment while reducing the possibility of damage to the package. It will be further appreciated that shaft 14 can be lengthened or shortened to accommodate different sizes of electronic packages, and that the point 16 can be enlarged or reduced to fit different printed circuit board hole sizes or printed circuit board thicknesses. It will be further appreciated that spring 18 could be integrated into pin 10, and it will be further appreciated that using existing molding capabilities, either two or four pins can be manufactured as one assembly.

While the invention has been described with particular reference to specific embodiments only, it is understood that the forms of the invention described in detail are to be taken as preferred embodiments thereof, and that various changes and modifications may be resorted to without departing from the spirit and scope of the invention as defined by the claims.

What we claim is:

1. A device for connecting a heat sink to an electronic device mounted on a printed circuit board or other connector comprising:

a shaft,
  said shaft being cylindrical and having an expanded top at one end, which top has a greater diameter than said shaft, said shaft having a cone disposed at an end opposite said top, said cone having a base disposed adjacent to said shaft and a tip disposed opposite said shaft, said base having a greater diameter than said shaft,
  said cone and at least a portion of said shaft adjacent to said cone having a slot therethrough so as to form on said cone a first prong and a second prong,
biasing means comprising a cylindrical spring surrounding said shaft and having a smaller diameter than said top and said base of said cone,
whereby when said device is in use, said device is connected to the heat sink or other connector by inserting said cone into a hole on the heat sink or other connector so that said first and said second prongs flex towards each other, the flexure of which serves to reduce the effective diameter of said cone, and after said cone has passed through the hole unflexing so as to hold the device to the heat sink or other connector, and said biasing means adapted to engage the heat sink or other connector when said device is in place so as to in cooperation with said expanded top of said shaft hold said base of said cone against the heat sink or other connector.

2. The device of claim 1 wherein said expanded top is cylindrical.

3. The device of claim 1 wherein said slot extends entirely through said cone and at least a portion of said shaft.

* * * * *